(12) United States Patent
Qiu et al.

(10) Patent No.: US 9,980,412 B2
(45) Date of Patent: May 22, 2018

(54) FLEXIBLE HEAT SPREADER

(71) Applicant: Intel Corporation, Santa Clara, CA (US)

(72) Inventors: Bo Qiu, Hillsboro, OR (US); Xi Guo, Hillsboro, OR (US); James C. Raupp, Hillsboro, OR (US); Michael Ahrens, San Jose, CA (US); David Pidwerbecki, Hillsboro, OR (US); Steven J. Lofland, Portland, OR (US); George H. Daskalakis, Forest Grove, OR (US); Stacy L. Yee, Portland, OR (US); Mark MacDonald, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/280,746

(22) Filed: Sep. 29, 2016

(65) Prior Publication Data

US 2018/0092253 A1    Mar. 29, 2018

(51) Int. Cl.
| | |
|---|---|
| *H05K 7/20* | (2006.01) |
| *G06F 1/16* | (2006.01) |
| *H05K 5/00* | (2006.01) |
| *H05K 5/02* | (2006.01) |
| *G06F 1/20* | (2006.01) |
| *H05K 1/02* | (2006.01) |
| *H05K 1/18* | (2006.01) |

(52) U.S. Cl.
CPC ....... *H05K 7/20509* (2013.01); *G06F 1/1681* (2013.01); *G06F 1/203* (2013.01); *H05K 1/0203* (2013.01); *H05K 1/181* (2013.01); *H05K 5/0017* (2013.01); *H05K 5/0226* (2013.01); *H05K 7/20409* (2013.01); *H05K 7/20963* (2013.01)

(58) Field of Classification Search
CPC .................. H05K 7/20509; H05K 1/0203
USPC .................. 361/679.27, 679.28, 679.54, 704
See application file for complete search history.

(56) References Cited

U.S. PATENT DOCUMENTS

| | | |
|---|---|---|
| 5,757,615 A | 5/1998 | Donahoe et al. |
| 5,910,883 A | 6/1999 | Cipolla et al. |
| (Continued) | | |

OTHER PUBLICATIONS

International Search Report and Written Opinion dated Dec. 13, 2017, issued in related International Application No. PCT/US2017/049077, 13 pages.

*Primary Examiner* — Mukund G Patel
(74) *Attorney, Agent, or Firm* — Schwabe, Williamson & Wyatt, P.C.

(57) ABSTRACT

Apparatuses, systems and methods associated with flexible heat spreader design are disclosed herein. In embodiments, an electronic device may include a component, a heat dissipation member, and a flexible member. The heat dissipation member may be coupled to the component via a flexible portion of the electronic device, the component located on a first side of the flexible portion and the heat dissipation member located on a second side of the flexible portion. The flexible member may be thermally coupled to the component and the heat dissipation member, wherein the flexible member extends along the flexible portion from the first side to the second side and is to transfer heat from the component to the heat dissipation member. Other embodiments may be described and/or claimed.

23 Claims, 6 Drawing Sheets

(56) References Cited

U.S. PATENT DOCUMENTS

| | | | |
|---|---|---|---|
| 8,675,363 B2* | 3/2014 | Crooijmans | H04M 1/0274 361/679.26 |
| 2002/0195177 A1* | 12/2002 | Hinkley | C22F 1/006 148/559 |
| 2003/0011983 A1 | 1/2003 | Chu et al. | |
| 2004/0114322 A1 | 6/2004 | Agata et al. | |
| 2009/0071632 A1 | 3/2009 | Bryant et al. | |

* cited by examiner

FLEXIBLE HEAT SPREADER

TECHNICAL FIELD

The present disclosure relates to the field of electronic circuits and apparatuses. More particularly, the present disclosure relates to flexible heat spreader design for removing thermal energy from electronic circuits of various electronic apparatuses.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Hinged computer devices often have a majority of heat generating components and/or components that generate a large amount of heat located in one side of the hinged computer devices. The other side of the hinged computer devices often has less heat generating components and/or components that generate a small amount of heat, causing the other side of the hinged computer devices to be cooler than the one side.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
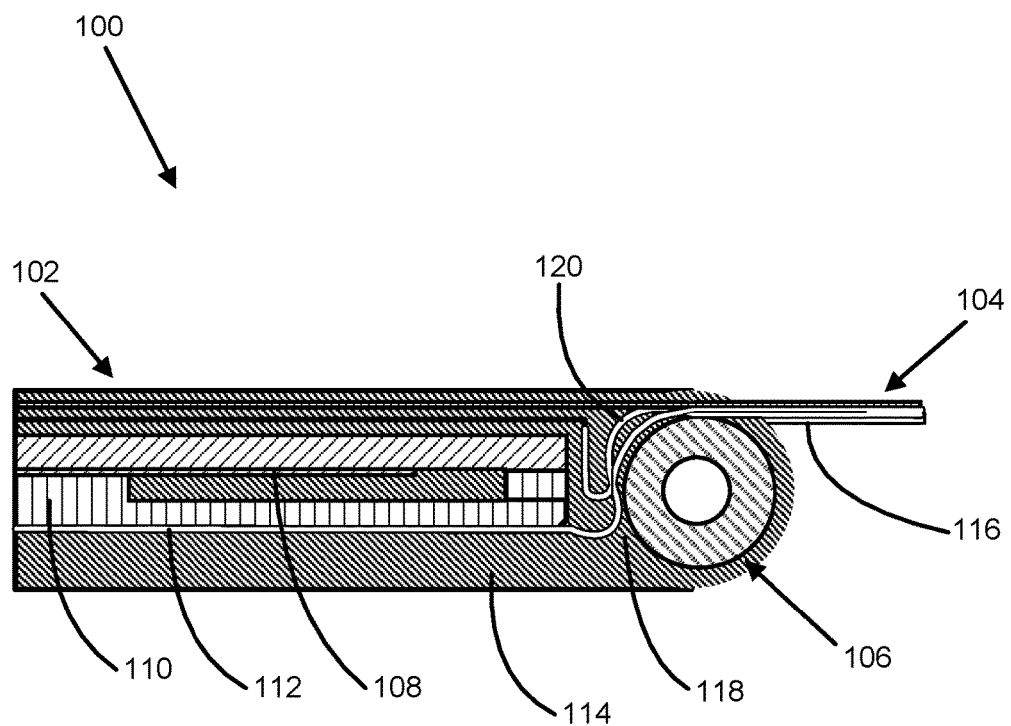
FIG. 1 illustrates an example hinged electronic device with a flexible heat spreader, according to various embodiments.

Apparatuses, systems, and methods associated with flexible heat spreader design are disclosed herein. In embodiments, an electronic device may include a component, a heat dissipation member, and a flexible member. The heat dissipation member may be coupled to the component via a flexible portion of the electronic device, the component located on a first side of the flexible portion and the heat dissipation member located on a second side of the flexible portion. The flexible member may be thermally coupled to the component and the heat dissipation member, wherein the flexible member extends along the flexible portion from the first side to the second side and is to transfer heat from the component to the heat dissipation member.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example hinged electronic device 100 with a flexible heat spreader, according to various embodiments. The hinged electronic device 100 may be a small form factor device designed for portability. The small form factor device may be a three-in-one device that may include functions and/or components of a phone, a tablet, a desktop computer, or some combination thereof. In some embodiments, the hinged electronic device 100 may be a hinged electronic device, such as a laptop computer, a phone (including smartphones, mobile phones, and flip phones), a computer tablet, a phablet, a desktop computer, an electronic organizer, a netbook, a notebook, an ultrabook, a personal digital assistant (PDA), an ultra-mobile PC, a handheld game, a foldable organic light-emitting diode (OLED) display, a watch (including a smart watch), a wearable electronic device and/or electronic device holders (such as clothing, wearable computer belts, sensors, phone holders, media player holders, virtual reality headsets, augmented reality headsets, head bands (including brain sensing head bands), and/or other similar wearable electronic devices and/or electronic holders), other similar electronic and/or computer devices, or some combination thereof, having at least two portions joined together at an hinge assembly.

The hinged electronic device 100 may include a first side 102 and a second side 104. A hinge assembly 106 may couple the first side 102 of the hinged electronic device 100 to the second side 104 of the hinged electronic device 100. The hinge assembly 106 may be referred to as a flexible portion of the hinged electronic device 100. The first side 102 and/or the second side 104 may rotate about the hinge assembly 106 as the hinge assembly 106 swivels. The hinge assembly 106 may provide 360 degree rotation as the hinge assembly 106 swivels. The first side 102 and/or the second side 104 may rotate from a closed position, where the first side 102 abuts the second side 104, to a plurality of open positions, where there is separation between the first side 102 and the second side 104.

The hinge assembly 106 may be a barrel hinge. The hinge assembly 106 may include a first leaf affixed to the first side 102 of the hinged electronic device 100 and a second leaf affixed to the second side 104 of the hinged electronic device 100. The first leaf and the second leaf of the hinge assembly 106 may be embedded in the material (such as a superelastic material, a molded plastic, a molded rubber, similar material, or some combination thereof) of the corresponding first side 102 and second side 104, affixing the first leaf and the second leaf to the first side 102 and the second side 104, respectively. In other embodiments, the first leaf and the second leaf may be affixed to the first side 102 and the second side 104, respectively, via epoxy, one or more fasteners (such as screws and/or bolts), welding, or some combination thereof. In some embodiments, the hinge assembly 106 may be a butt hinge, a continuous hinge, a flush hinge, a concealed hinge, a tee hinge, a double action hinge, a friction hinge, a Soss hinge, a T-hinge, or some combination thereof.

The first side 102 of the hinged electronic device 100 may include one or more electronic components, such as electronic component 108. The electronic component 108 may include a system-on-chip, an integrated circuit package, a computer processor unit, a memory device, a transistor, a power supply, a printed circuit board, a resistor, a capacitor, an inductor, other computer components and/or electronic components, or some combination thereof. In some embodiments, the electronic component may be attached to a printed circuit board of the hinged electronic device 100. The electronic component 108 may be part of electronic and/or computer circuitry of the hinged electronic device 100. The electronic component 108 may produce heat when power is applied to the electronic component 108 and/or may be coupled to another electronic component that produces heat when power is applied to the electronic component or the other electronic component, respectively.

The first side 102 of the hinged electronic device 100 may further include a heat spreader 110. The heat spreader 110 may be affixed to the electronic component 108. The heat spreader 110 may be thermally coupled to the electronic component 108 via the affixation, such that heat produced by the electronic component 108 may be transferred to the heat spreader 110. The heat spreader 110 may be formed of a material with a high thermal conductivity, such as copper, copper alloy, aluminum, aluminum alloy, gold, graphite, graphene, silver, tin, or some combination thereof.

The hinged electronic device 100 may include a flexible member 112 that extends from the first side 102, across hinge assembly 106 to the second side 104. On the first side 102, flexible member 112 may be thermally coupled to the electronic component 108. The flexible member 112 may be thermally coupled to the electronic component 108 within the first side 102 of the hinged electronic device 100, such that heat produced by the electronic component 108 may be transferred to the flexible member 112.

The flexible member 112 may be thermally coupled to the electronic component 108 via the heat spreader 110. A portion of the flexible member 112 may be affixed to the heat spreader 110, with the portion of the flexible member 112 located within the first side 102 of the hinged electronic device 100. The portion of the flexible member 112 may be affixed to the heat spreader 110 via a pressure sensitive adhesive. The pressure sensitive adhesive may be thermally conductive and may include thermal tape, thermal adhesive sheets, or some combination thereof. The pressure sensitive adhesive may be selected to withstand perspective operational temperatures of the heat spreader 110 and/or the electronic component 108. In some embodiments, the pressure sensitive adhesive may be capable of withstanding temperatures between 0 degrees Celsius and 70 degrees Celsius.

In some embodiments, the portion of the flexible member 112 may be affixed to the heat spreader 110 by a different type of adhesive, such as epoxy, fasteners, tape, adhesive sheets, or some combination thereof, where the different type of adhesive may or may not be thermally conductive. Further, in some embodiments, the portion of the flexible member 112 may be held against the heat spreader 110 by a different part of the first side 102, such as a chassis 114.

In some embodiments, the portion of the flexible member 112 may be affixed directly to the electronic component 108. In these embodiments, the hinged electronic device 100 may not include the heat spreader 110 affixed to the electronic component 108 or the heat spreader 110 may be affixed to the electronic component 108 on an opposite side from where the portion of the flexible member 112 is affixed to the electronic component 108. The flexible member 112 may be affixed to the electronic component 108 by any of the means of affixing the flexible member to the heat spreader described above, including the pressure sensitive adhesive, the different type of adhesive, and/or being held against the electronic component 108.

The flexible member 112 may include a flexible material with high thermal conductivity, such as graphite, graphene, or some combination thereof. The flexible member 112 may include a graphite film, a graphite sheet, or some combination thereof. The flexible member 112 may transfer heat from one portion of the flexible member 112 to a different portion of the flexible member 112, the flexible member 112 having a low amount of thermal resistance due to the flexible material 112 including graphite, graphene, or some combination thereof.

The hinged electronic device 100 may include a heat dissipation member 116. The heat dissipation member 116 may be located in the second side 104 of the hinged electronic device 100. The heat dissipation member 116 may be located, at least partially, along an exterior of the second side 104. In some embodiments, the heat dissipation member 116 may include a protective layer that extends along at least a portion of the exterior of the second side 104. A portion of the flexible member may extend along the protective layer in the second side of the hinged electronic device 100 and the protective layer may protect the flexible member from physical damage. Further, in some embodiments, the heat dissipation member 116 may be a coating applied to at least a portion of the flexible member 112 that extends into the second side 104, the coating extending along the exterior of the second side 104 and to protect the flexible member 112 from physical damage.

The second side 104 may include a screen display that extends along one surface of the second side 104 and the heat dissipation member 116 may extend along an opposite surface of the second side 104 to the screen display. The screen display may include a flexible OLED lamination. The screen display may be coupled to the electronic circuitry and/or the computer circuitry of the hinged electronic device 100 and operate as a display of the hinged electronic device 100.

A portion of the flexible member 112, separate from the portion affixed to the electronic component 108 and/or the heat spreader 110, may be affixed to the heat dissipation member 116. The portion of the flexible member 112 may be affixed to the heat dissipation member 116 within the second side 104 of the hinged electronic device 100. The affixation of the flexible member 112 to the heat dissipation member 116 may thermally couple the flexible member 112 to the heat dissipation member 116. The flexible member 112 may be affixed to the heat dissipation member 116 by any of the means used for affixation of the flexible member 112 to the heat spreader 110 described above.

With the flexible member 112 affixed to the electronic component 108 and/or the heat spreader 110 and the flexible member 112 affixed to the heat dissipation member 116, the flexible member may extend from the first side 102 of the hinged electronic device 100 to the second side 104 of the hinged electronic device 100 across the hinge assembly 106. A portion of the flexible member 112, intermediate to the portion affixed to the electronic component 108 and/or the heat spreader 110 and the portion affixed to the heat dissipation member 116, may extend around a circumference of the hinge assembly 106. The flexible member 112 may flex about the hinge assembly 106 as the hinge assembly 106 swivels. In some embodiments, the portion of the flexible member 112, intermediate to the portion affixed to the electronic component 108 and/or the heat spreader 110 and the portion affixed to the heat dissipation member 106, may abut the circumference of the hinge assembly 106, may pass through a portion of the hinge assembly 106, or some combination thereof.

The flexible member 112 may facilitate transfer of heat between the electronic component 108 and the heat dissipation member 116. As the electronic component 108 produces heat, the heat may be transferred via the flexible member 112 from the electronic component 108, across the hinge assembly 106, and to the heat dissipation member 116. The heat dissipation member 116 may then dissipate the heat to the environment surrounding the hinged electronic device 100.

In some embodiments, the heat dissipation member 116 may be omitted. In these embodiments, the flexible member 112 may extend within the second side 104 of the hinged electronic device 100 and may dissipate the heat from the flexible member 112 to the environment surrounding the hinged electronic device 100 from the second side 104 of the hinged electronic device 100. The flexible member 112 may extend along at least a portion of the exterior of the second side 104 and may abut the environment surrounding the hinged electronic device 100.

A superelastic material 118 may be formed around at least a portion of the hinge assembly 106 and may be located intermediate to the hinge assembly 106 and the flexible member 112. The superelastic material 118 may include nitinol, graphene, copper-zinc-aluminum, copper-aluminum, nickel-titanium alloys, or some combination thereof. The superelastic material 118 may flex as the hinge assembly 106 swivels.

The hinged electronic device 100 may include a structural memory member 120. The structural memory member 120 may include a shape-memory alloy, such as nitinol memory alloy, copper-aluminum-nickel memory alloy, copper-zinc-aluminum memory alloy, iron-manganese-silicon memory alloy, or some combination thereof. The structural memory member 120 may extend along a portion of the flexible member 112 from the first side 102, across the hinge assembly 106, and into the second side 104. The structural memory member 120 may be located on an opposite side of the flexible member 112 from the hinge assembly 106. The structural memory member 120 may flex as the hinge assembly 106 swivels and return to an original shape in response to an application of heat.

The hinged electronic device 100 may include the chassis 114. The chassis 114 may encompass the components within the first side 102 of the hinged electronic device 100, including the hinge assembly 106, the electronic component 108, the electronic circuitry and/or the computer circuitry, the heat spreader 110, the flexible member 112, the superelastic material 118, the structural memory member 120, or some combination thereof. The chassis 114 may be formed of a rigid material (such as a hard plastic, hard rubber, metal, metal alloy, similar materials, or some combination thereof) and may protect the components within the first side 102 from physical damage.

Figure 2:
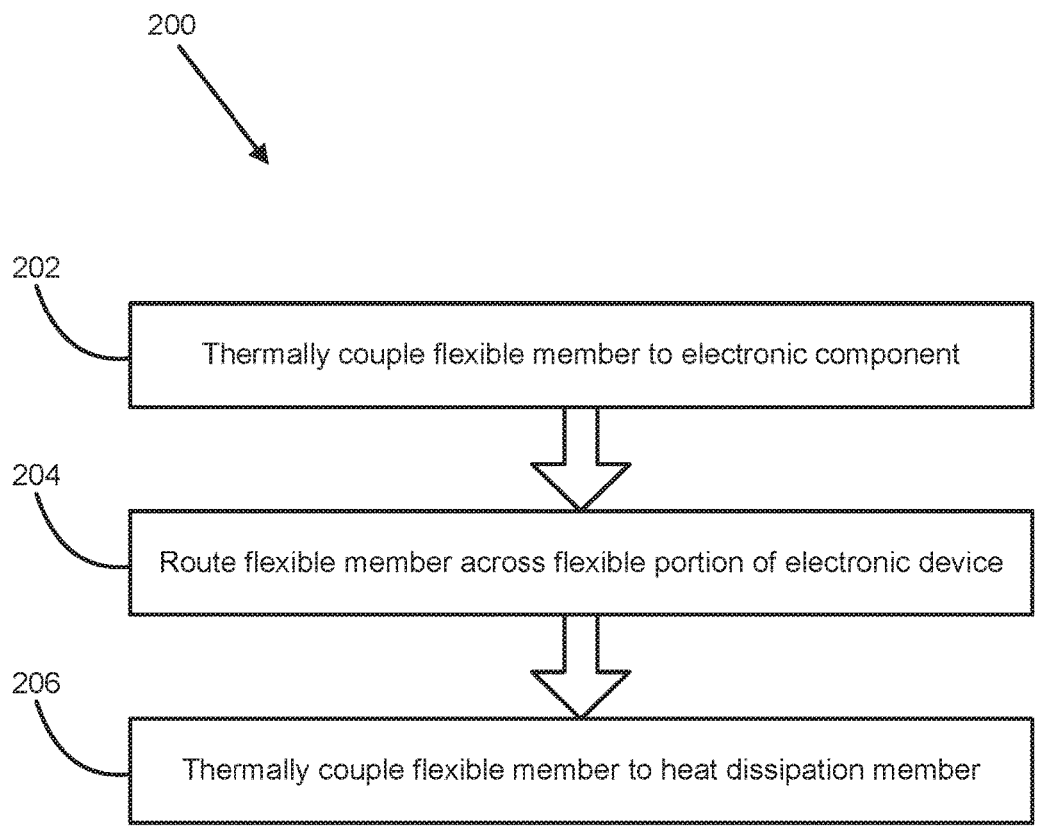
FIG. 2 illustrates an example process of applying a flexible heat spreader within a hinged electronic device, according to various embodiments.

FIG. 2 illustrates an example process 200 of applying a flexible heat spreader within an electronic device, according to various embodiments. The electronic device may include one or more of the features of the hinged electronic device 100 (FIG. 1), the hinged electronic device 300 (FIG. 3), the electronic device 500 (FIG. 5), or some combination thereof.

In 202, a flexible member of the flexible heat spreader may be thermally coupled to an electronic component. The flexible member may include one or more of the features of the flexible member 112 (FIG. 1), the flexible member 318 (FIG. 3), the flexible member 508 (FIG. 5), or some combination thereof. The electronic component may include one or more of the features of the electronic component 108 (FIG. 1), the electronic component 314 (FIG. 3), the electronic component 512 (FIG. 5), or some combination thereof. The electronic component may be located on a first side of a flexible portion of the electronic device and the flexible member may be thermally coupled to the electronic component on the first side of the flexible portion.

In some embodiments, the flexible portion may be a hinge assembly that connects a first side of the electronic device to a second side of the electronic device. In these embodiments, the electronic component may be located in the first side of the electronic device and the flexible member may be thermally coupled to the electronic component within the first side of the hinged electronic device.

Thermally coupling the flexible member to the electronic component may include affixing a portion of the flexible member to a heat spreader coupled to the electronic component. The heat spreader may include one or more of the features of the heat spreader 110 (FIG. 1). The flexible member may be affixed to the heat spreader by any of the means of affixing the flexible member 112 to the heat spreader 110 described above.

A pressure sensitive adhesive may be attached to one or both of the portions of the flexible member and the heat spreader. The portion of the flexible member may be positioned against the heat spreader and the portion of the flexible member and the heat spreader may be compressed together causing the pressure sensitive adhesive to affix the portion of the flexible member to the heat spreader.

In some embodiments, an epoxy may be applied to one or both of the portion of the flexible member and the heat spreader. The portion of the flexible member may be positioned against the heat spreader. The flexible member may be maintained in contact with the heat spreader while the epoxy is cured. Curing of the epoxy may include application of light, heat, chemicals, pressure, or some combination thereof, to the epoxy, the portion of the flexible member, and/or the heat spreader.

In some embodiments, the flexible member may be thermally coupled to the electronic component by directly affixing the flexible member to the electronic component. The flexible member may be affixed to the electronic component by any of the means of affixing the flexible member 112 to the heat spreader 110 described above. In particular, a portion of the flexible member may be affixed to the electronic component using pressure sensitive adhesive, epoxy, or some combination thereof, as described above for affixing of the flexible member to the heat spreader.

In 204, the flexible member may be routed across the flexible portion from a first side of the flexible portion to a second side of the flexible portion. Routing the flexible member across the flexible portion may include affixing the flexible member to the flexible portion, embedding the flexible member in the flexible portion, or some combination thereof.

In embodiments where the flexible portion is a hinge assembly, the flexible member may be routed across the hinge assembly of the hinged electronic device from the first side of the hinged electronic device to the second side of the hinged electronic device. The hinge assembly may include one or more of the features of the hinge assembly 106 (FIG. 1). Routing the flexible member across the hinge assembly may include forming a superelastic material along at least a portion of a circumference of the hinge assembly. The superelastic material may include one or more of the features of the superelastic material 118 (FIG. 1). In some embodiments, the superelastic material may be formed around an entirety of the circumference of the hinge assembly. The flexible member may be routed along an opposite side of the superelastic material from the hinge assembly. In some embodiments, a portion of the flexible member may abut the superelastic material on the opposite side of the superelastic material from the hinge assembly.

In some embodiments, routing the flexible member across the flexible portion may further include routing a structural memory member across the flexible portion along the flexible member. The structural memory member may include one or more of the features of the structural memory member 120 (FIG. 1). In embodiments where the flexible portion is a hinge assembly, the structural memory member may be routed along the flexible member on an opposite side of the flexible member from the hinge assembly. In some embodiments, the structural memory member may abut the at least a portion of the flexible member on the opposite side of the flexible member from the hinge assembly.

In 206, the flexible member may be thermally coupled to a heat dissipation member located on a second side of the flexible portion. The heat dissipation member may include one or more of the features of the heat dissipation member 116 (FIG. 1), the heat dissipation member 320 (FIG. 3), the heat dissipation member of FIG. 5 (the clasp 510), or some combination thereof. In some embodiments, the heat dissipation member may be a thermally conductive case of the electronic device. The flexible member may be thermally coupled to the heat dissipation member by affixing a portion of the flexible member to the heat dissipation member via any of the means of affixing the flexible member 112 to the heat spreader 110 described above. In embodiments where the flexible portion is a hinge assembly, the flexible member may be thermally coupled to the heat dissipation member in a second side of the electronic device, the second side of the electronic device located on an opposite side of the hinge assembly from the first side of the electronic device that includes the electronic component.

A pressure sensitive adhesive may be attached to one or both of the portion of the flexible member and the heat dissipation member. The portion of the flexible member may be positioned against the heat spreader and the portion of the flexible member and the heat dissipation member may be compressed together causing the pressure sensitive adhesive to affix the portion of the flexible member to the heat dissipation member.

In some embodiments, an epoxy may be applied to one or both of the portion of the flexible member and the heat dissipation member. The portion of the flexible member may be positioned against the heat dissipation member. The flexible member may be maintained in contact with the heat dissipation member while the epoxy is cured. Curing of the epoxy may include application of light, heat, chemicals, pressure, or some combination thereof, to the epoxy, flexible member, and/or heat dissipation member.

It is to be understood that the features of process 200 may be performed in any order and are not limited to the order described. Further, certain features described in relation to 202, 204, and/or 206 may be performed in different order and/or separate from other features described in relation to 202, 204, and/or 206, respectively.

Figure 3:
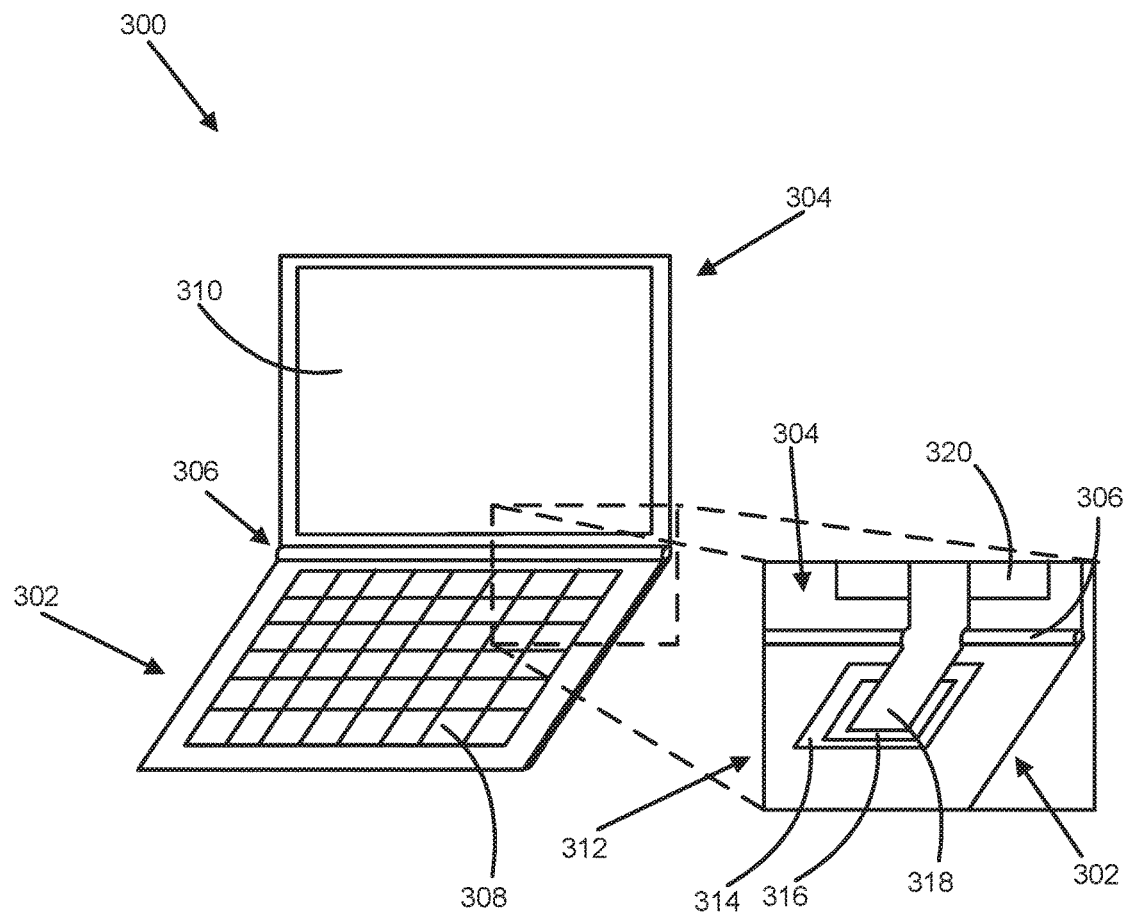
FIG. 3 illustrates another example hinged electronic device having a flexible heat spreader, according to various embodiments.

FIG. 3 illustrates an example hinged electronic device 300 having a flexible heat spreader, according to various embodiments. The hinged electronic device 300 may include a first side 302 and a second side 304 coupled to each other by a hinge assembly 306 located intermediate to the first side 302 and the second side 304. The first side 302 may include one or more of the features of the first side 102 (FIG. 1), including the electronic circuitry and/or the computer circuitry, the electronic component 108, the heat spreader 110, the flexible member 112, the chassis 114, the superelastic material 118, the structural memory member 120, or some combination thereof. The second side 304 may include one or more of the features of the second side 104 (FIG. 1), including the portion of the flexible member 112 that extends into the second side, the heat dissipation member 116, the structural memory member 120, or some combination thereof. The hinge assembly 306 may include one or more of the features of the hinge assembly 106 (FIG. 1). The hinge assembly 306 may be referred to as a flexible portion of the hinged electronic device 300. The hinged electronic device 300 may be a laptop computer, as illustrated. In some embodiments, the hinged computer device 300 may be a small form factor device, a phone (including smartphones, mobile phones, and flip phones), a computer tablet, a phablet, a desktop computer, an electronic organizer, a netbook, a notebook, an ultrabook, a personal digital assistant (PDA), an ultra-mobile PC, a handheld game, a foldable organic light-emitting diode (OLED) display, a watch (including a smart watch), a wearable electronic device and/or electronic device holders (such as clothing, wearable computer belts, sensors, phone holders, media player holders, virtual reality headsets, augmented reality headsets, head bands (including brain sensing head bands), and/or other similar wearable electronic devices and/or electronic holders), other similar electronic and/or computer devices, or some combination thereof.

The hinged electronic device 300 may include an input interface 308. The input interface 308 may be located in the first side 302 of the hinged electronic device 300 and may be located on an exterior of the first side 302. The input interface 308 may be a user input interface, such as a keyboard, a touchpad, a pointing stick, or some combination thereof. The input interface 308 may be coupled to the electronic circuitry and/or the computer circuitry within the first side 302 and may allow for interaction with the electronic circuitry and/or the computer circuitry.

The hinged electronic device 300 may include a display screen 310 located in the second side 304 of the hinged electronic device 300. The display screen 310 may be coupled to the electronic circuitry and/or the computer circuitry within the first side 302 of the hinged electronic device 300 and may operate as an output display for the hinged electronic device 300. In some embodiments, the display screen 310 may be a touchscreen display screen, allowing for input to the electronic circuitry and/or the computer circuitry based on contact with the display screen 310.

The hinge assembly 306 may swivel in response to force applied to the first side 302 of the hinged electronic device 300 and/or the second side 304 of the hinged electronic device 300. In some embodiments, the hinge assembly 306 may further swivel in response to heat applied to a structural memory member (such as structural memory member 120 (FIG. 1)) located within the hinged electronic device 300. As the hinge assembly swivels, the first side 302 and/or the second side 304 may rotate about the hinge assembly 306. The first side 302 and/or the second side 304 may rotate from a closed position, where the first side 302 and the second side 304 abut each other with the input interface 308 abutting (or within an inch of) the display screen 310, to a plurality of open positions where the input interface 308 does not abut the display screen 310.

As with the hinged electronic device 100 (FIG. 1), the hinged electronic device 300 may include a flexible member that is thermally coupled to an electronic component in the first side 302 of the hinged electronic device 300, extends across the hinge assembly 306, and is thermally coupled to a heat dissipation member in the second side 304 of the hinged electronic device 300. As the hinge assembly 306 swivels with the first side 302 and/or the second side 304 rotating about the hinge assembly 306, the flexible member may flex.

Inlay 312 illustrates an expanded view of an example internal layout of a portion of the hinged electronic device 300, according to various embodiments. The hinged electronic device 300 may include an electronic component 314 located within the first side 302 of the hinged electronic device 300. The electronic component 314 may include one or more of the features of the electronic component 108 (FIG. 1). A heat spreader 316 may be coupled to the electronic component 314. The heat spreader 316 may include one or more of the features of the heat spreader 110 (FIG. 1).

A portion of a flexible member 318 may be thermally coupled to the electronic component 314 via the heat spreader 316. The flexible member 318 may include one or more of the features of the flexible member 112 (FIG. 1). The portion of the flexible member 318 may be affixed to the heat spreader 316 by any means for affixing the flexible member 112 to the heat spreader 110 described in relation to FIG. 1. The portion of the flexible member 318 may be affixed to the heat spreader 316 within the first side 302 of the hinged electronic device 300 and may extend across the hinge assembly 306 into the second side 304 of the hinged electronic device 300. In some embodiments, the heat spreader 316 may be omitted and the portion of the flexible member 318 may be affixed directly to the electronic component 314 within the first side 302 of the hinged electronic device 300.

The hinged electronic device 300 may include a heat dissipation member 320 located within the second side 304 of the hinged electronic device 300. The heat dissipation member 320 may include one or more of the features of the heat dissipation member 116 (FIG. 1). Another portion of the flexible member 318 may be thermally coupled to the heat dissipation member 320 within the second side 304 of the hinged electronic device 300. The portion of the flexible member 318 may be affixed to the heat dissipation member 320 within the second side 304 of the hinged electronic device 300, providing the thermal coupling. The portion of the flexible member 318 may be affixed to the heat dissipation member 320 by any of the means for affixing the flexible member 112 to the heat dissipation member 116 described in relation to FIG. 1.

While FIG. 3 illustrates a laptop computer, it is to be understood that the hinged electronic device 300, and the features of the hinged electronic device 300, described are not limited to a laptop computer. The hinged electronic device 300 may be any hinged electronic device, including a small form factor device, a phone (including smartphones, mobile phones, and flip phones), a computer tablet, a phablet, a desktop computer, an electronic organizer, a netbook, a notebook, an ultrabook, a personal digital assistant (PDA), an ultra-mobile PC, a handheld game, a foldable organic light-emitting diode (OLED) display, a watch (including a smart watch), a wearable electronic device and/or electronic device holders (such as clothing, wearable computer belts, sensors, phone holders, media player holders, virtual reality headsets, augmented reality headsets, head bands (including brain sensing head bands), and/or other similar wearable electronic devices and/or electronic holders), other similar electronic and/or computer devices, or some combination thereof.

Figure 4:
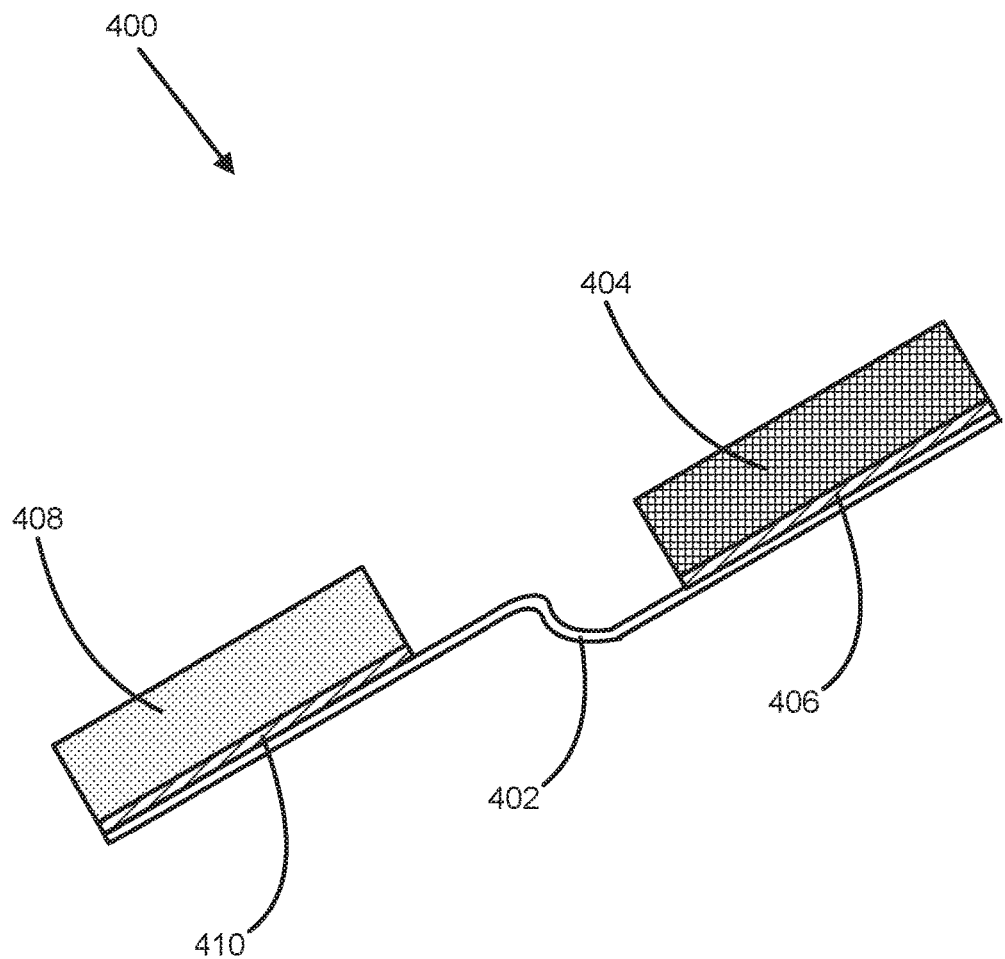
FIG. 4 illustrates an example flexible heat spreader assembly, according to various embodiments.

FIG. 4 illustrates an example flexible heat spreader assembly 400 coupled to a heat producing component 408, according to various embodiments. The flexible heat spreader assembly 400 may include a flexible member 402. The flexible member 402 may include one or more of the features of the flexible member 112 (FIG. 1), including the flexible member 402 being a graphite film, graphite sheet, or some combination thereof, and the flexible member 402 having high thermal conductivity.

The example heat spreader assembly 400 may include a heat dissipation member 404. The heat dissipation member 404 may include one or more of the features of the heat dissipation member 116 (FIG. 1). The heat dissipation member 404 may be a heat sink, which may release heat into an environment surrounding and/or in contact with the heat dissipation member 404. In some embodiments, the heat dissipation member 404 may be an active cooling device, such as an air conditioner, a thermoelectric cooler, or some combination thereof, which may actively cool the flexible member 402 by increasing an amount of heat transfer to the environment surrounding and/or in contact with the heat dissipation member.

The heat dissipation member 404 may be affixed to a portion of the flexible member 402 via attachment layer 406.

The heat dissipation member 404 may be thermally coupled to the flexible member 402 via the attachment layer 406. The attachment layer 406 may be a pressure sensitive adhesive, such as the pressure sensitive adhesive described in relation to FIG. 1. The heat dissipation member 404 may be aligned with the portion of the flexible member 402 with the attachment layer 406 located between the heat dissipation member 404 and the portion of the flexible member 402. The heat dissipation member 404 and the portion of the flexible member 402 may be compressed together with the attachment layer 406 located between the heat dissipation member 404 and the portion of the flexible member 402, the attachment layer 406 affixing the heat dissipation member 404 to the portion of the flexible member 402 in response to the compression.

In some embodiments, the attachment layer 406 may be and/or include an epoxy, such as the epoxy described in relation to FIG. 1. The heat dissipation member 404 may be positioned on the portion of the flexible member 402 with the attachment layer 406 located between the heat dissipation member 404 and the portion of the flexible member 402. The attachment layer 406 may be cured with the heat dissipation member 404 positioned on the portion of the flexible member 402, the attachment layer 406 affixing the heat dissipation member 404 to the portion of the flexible member 402 in response to the curing. Curing the attachment layer 406 may include applying heat, light, chemicals, pressure, or some combination thereof to the attachment layer 406, the flexible member 402, and/or the heat dissipation member 404.

A different portion of the flexible member 402 may be affixed to the heat producing component 408. The different portion of the flexible member 402 may be thermally coupled to the heat producing component 408 based on the affixation. The different portion of the flexible member 402 may be affixed to the heat producing component 408 by a second attachment layer 410. The second attachment layer 410 may include one or more of the features of the attachment layer 406 and may affix the different portion of the flexible member 402 to the heat producing component 408 by any means of affixation described in relation to the attachment layer 406 described above. In some embodiments, the second attachment layer 410 may be omitted and the different portion of the flexible member 402 may be positioned against the heat producing component 408 by a compression force applied to the different portion of the flexible member 402 and/or heat producing component 408.

The heat producing component 408 may be a computer component. In some embodiments, the heat producing component 408 may be an electronic component, a mechanical component, a living organism (such as the human body), or some combination thereof. The flexible member 402 may receive heat from the heat producing component 408 and transfer the heat to the heat dissipation member 404 for dissipating the heat into the environment surrounding and/or in contact with the heat dissipation member 404.

The flexible member 402 may be routed within and/or along any flexible mechanism, such as the hinge assembly 106 (FIG. 1) and the hinge assembly 306 (FIG. 3). In some embodiments, the flexible member 402 may be routed within and/or along a flexible material, such as cloth, flexible rubber, flexible plastic, similar flexible materials, or some combination thereof. For example, the flexible member 402 may be routed within an article of clothing (such as a t-shirt) and may transfer heat from an individual wearing the article of clothing to the surrounding environment. Further, the flexible member 402 may be embedded within a wearable device and transfer heat from one or more heat producing components of the wearable device, through the heat dissipation member 404, to the surrounding environment. The surrounding environment may include the person wearing the wearable device.

In other embodiments, the heat dissipation member 404 may produce heat rather than dissipating heat. In these embodiments, the heat dissipation member 404 may transfer heat to the flexible member 402 that may, in turn, heat the heat producing component 408. For example, flexible member 402 may be embedded within an article of clothing and may transfer heat from the heat dissipation member 404 to a person wearing the article of clothing to warm the person.

Figure 5A:
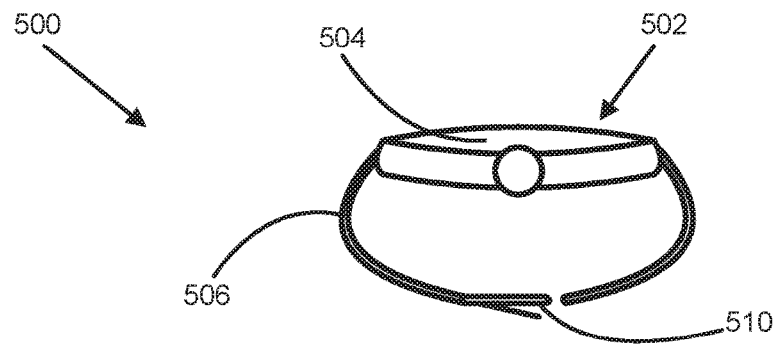
FIG. 5A illustrates a side view an example electronic device with flexible portions that implements a flexible heat spreader, according to various embodiments.

FIG. 5A illustrates a side view an example electronic device 500 with flexible portions that implements a flexible heat spreader, according to various embodiments. The electronic device 500 may be a watch (including a smart watch), as illustrated. In some other embodiments, the electronic device 500 may be a laptop computer, a small form factor device, a phone (including smartphones, mobile phones, and flip phones), a computer tablet, a phablet, a desktop computer, an electronic organizer, a netbook, a notebook, an ultrabook, a personal digital assistant (PDA), an ultra-mobile PC, a handheld game, a foldable organic light-emitting diode (OLED) display, a watch (including a smart watch), a wearable electronic device and/or electronic device holders (such as clothing, wearable computer belts, sensors, phone holders, media player holders, virtual reality headsets, augmented reality headsets, head bands (including brain sensing head bands), and/or other similar wearable electronic devices and/or electronic holders), other similar electronic and/or computer devices, or some combination thereof. The flexible heat spreader may include one or more of the features of the flexible heat spreader assembly 400 (FIG. 4).

The electronic device 500 may include rigid portions and/or flexible portions. In the watch illustrated, the rigid portions may include a body 502 of the electronic device 500. The body 502 may include electronic circuitry and/or computer circuitry. The electronic circuitry and/or the computer circuitry may include an electronic component, such as the electronic component 108 (FIG. 1) and/or the electronic component 314 (FIG. 3). In some embodiments, the body 502 may include a display 504. The display 504 may include a touch screen display, a flexible organic light-emitting diode (OLED) lamination, an electronic display, a digital display, an analog display, or some combination thereof.

In the watch illustrated, the flexible portions may include flexible straps 506. The flexible straps 506 may be directly connected to the body 502, connected to the body by a hinge assembly, or some combination thereof. The flexible straps 506 may be formed any flexible material, such as cloth, flexible rubber, flexible plastic, flexible metal, or some combination thereof.

The electronic device 500 may include a heat dissipation member. The heat dissipation member may include one or more of the features of the heat dissipation member 116 (FIG. 1), the heat dissipation member 320 (FIG. 3), or some combination thereof. In the watch illustrated, the heat dissipation member may be the clasp 510. The clasp 510 may be formed of thermally conductive material, such as thermally conductive metal. The clasp 510 may receive heat and dissipate heat into the environment surrounding the watch.

Figure 5B:
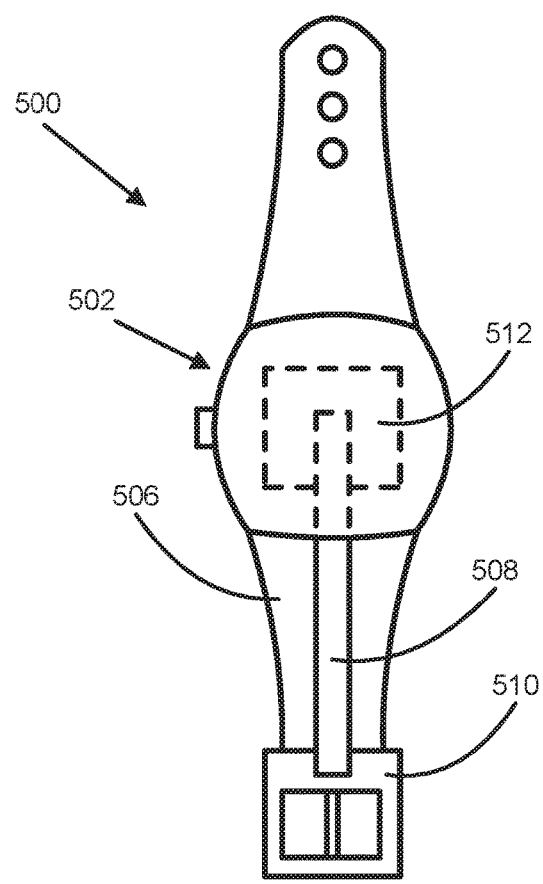
FIG. 5B illustrates a bottom view the example electronic device with flexible portions of FIG. 5A that implements the flexible heat spreader, according to various embodiments.

The electronic device 500 may further include a flexible member 508 (illustrated in FIG. 5B). The flexible member 508 may be thermally coupled to an electronic component within the body 502 and the heat dissipation member (the clasp 510 in the watch illustrated). The flexible member 508 may extend from the electronic component, along the flexible portion of the electronic device (the flexible strap 506 in the watch illustrated), to the heat dissipation member. The flexible member 508 may transfer heat from the electronic component to the heat dissipation, which may dissipate the heat into the environment surrounding the electronic device 500.

FIG. 5B illustrates a bottom view the example electronic device 500 with flexible portions of FIG. 5A that implements the flexible heat spreader, according to various embodiments. The dashed lines illustrated in FIG. 5B signify that the portions illustrated in the dashed lines are located within the body 502 of the watch.

The electronic circuitry and/or the computer circuitry located within the body 502 (as described in FIG. 5A) may include an electronic component 512. The electronic component 512 may include one or more of the features of the electronic component 108 (FIG. 1), the electronic component 314 (FIG. 3), or some combination thereof. The electronic component 512 may include a system-on-chip, an integrated circuit package, a computer processor unit, a memory device, a transistor, a power supply, a printed circuit board, a resistor, a capacitor, an inductor, other computer components and/or electronic components, or some combination thereof. In some embodiments, the electronic component may be attached to a printed circuit board of the electronic device 500. The electronic component 512 may produce heat when power is applied to the electronic component 512 and/or may be coupled to another electronic component that produces heat when power is applied to the electronic component or the other electronic component, respectively. In some embodiments, the heat member 508 may be thermally coupled to a heat spreader of the electronic component 512.

The flexible member 508 may extend into the body 502 and may be thermally coupled within the body 502. The flexible member 508 may be affixed to electronic component 512 via a pressure sensitive adhesive. The pressure sensitive adhesive may be thermally conductive and may include thermal tape, thermal adhesive sheets, or some combination thereof. The pressure sensitive adhesive may be selected to withstand perspective operational temperatures of the electronic component 512. In some embodiments, the pressure sensitive adhesive may be capable of withstanding temperatures between 0 degrees Celsius and 70 degrees Celsius.

In some embodiments, the flexible member 508 may be affixed to the electronic component 512 by a different type of adhesive, such as epoxy, fasteners, tape, adhesive sheets, or some combination thereof, where the different type of adhesive may or may not be thermally conductive. Further, in some embodiments, the flexible member 508 may be held against the electronic component 512 by a portion of the body 502.

The flexible member 508 may extend outside of the body, along the flexible portion (flexible strap 506) of the electronic device 500, to the heat dissipation member (clasp 510). The flexible member 508 may be affixed to the flexible portion, embedded in the flexible portion, or some combination thereof. The flexible member 508 may be thermally coupled to the heat dissipation member on an opposite side of the flexible portion. The flexible member 508 may transfer heat from the electronic component 512 to the heat dissipation member. The heat dissipation member may dissipate the heat from the electronic component 512 into the environment surrounding the electronic device 500.

While the electronic device 500 is illustrated as a watch in FIGS. 5A and 5B, it is to be understood that the electronic device 500 is not limited to this embodiment. The electronic device 500 may be any electronic device with an electronic component located on a first side of a flexible portion of the electronic device and a heat dissipation member located on a second side of the flexible portion, where the second side may be located on an opposite side of the flexible portion from the first side. For example, the electronic device 500 may be a small form factor device, a laptop computer, a phone (including smartphones, mobile phones, and flip phones), a computer tablet, a phablet, a desktop computer, an electronic organizer, a netbook, a notebook, an ultrabook, a personal digital assistant (PDA), an ultra-mobile PC, a handheld game, a foldable organic light-emitting diode (OLED) display, a watch (including a smart watch), a wearable electronic device and/or electronic device holders (such as clothing, wearable computer belts, sensors, phone holders, media player holders, virtual reality headsets, augmented reality headsets, head bands (including brain sensing head bands), and/or other similar wearable electronic devices and/or electronic holders), other similar electronic and/or computer devices, or some combination thereof, where a first portion of the electronic device includes an electronic component and is connected to a second portion of the electronic device by a flexible portion, the second portion including a heat dissipation member.

Figure 6:
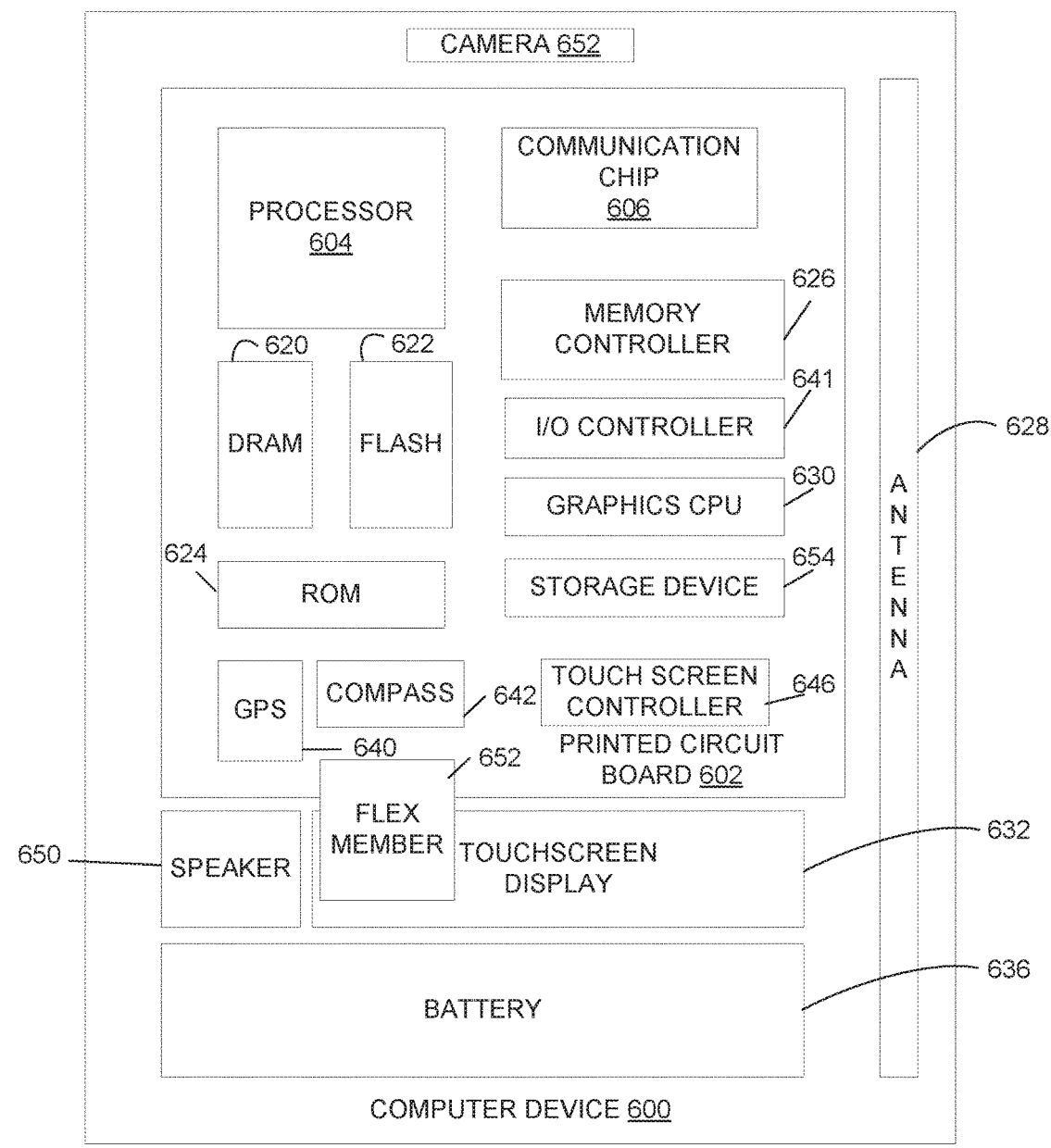
FIG. 6 illustrates an example computer device that may employ the apparatuses and/or methods described herein.

FIG. 6 illustrates an example computer device 600 that may employ the apparatuses and/or methods described herein (e.g., the hinged computer device 100, the hinged computer device 300, the heat spreader assembly 400, the flexible member 112, the flexible member 402, and/or the flexible member 552), in accordance with various embodiments. As shown, computer device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computer device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computer device 600 may include other components that may or may not be physically and electrically coupled to the PCB 602. These other components include, but are not limited to, memory controller 626, volatile memory (e.g., dynamic random access memory (DRAM) 620), non-volatile memory such as read only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In various embodiments, a flexible member 652 may be thermally coupled to one or more of the components of the computer device 600. The flexible member 652 may include one or more of the features of the flexible member 112 (FIG. 1), the flexible member 318 (FIG. 3), the flexible member 402 (FIG. 4), the flexible member 508 (FIG. 5), or some combination thereof. The flexible member 652 may be further thermally coupled to the touchscreen display 632, a portion of the computer device 600 that includes the touchscreen display 632, or some combination thereof. A flexible portion (including a hinge assembly (such as the hinge assembly 106 (FIG. 1), and/or the hinge assembly 306 (FIG. 3)), flexible portions (such as the flexible portions 506 (FIG. 5)), and/or other similar flexible elements) of the computer device 600 may be located between the component to which the flexible member 652 is thermally coupled and the touchscreen display 632 and/or the portion of the computer device 600 that includes the touchscreen display 632. The flexible member 652 may extend along the flexible portion from the component to the touchscreen display 632 and/or the portion of the computer device 600.

In some embodiments, the one or more processor(s) 604, flash memory 622, and/or storage device 654 may include associated firmware (not shown) storing programming instructions configured to enable computer device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 622, or storage device 654.

In various embodiments, the computer device 600 may be a hinged computer device, such as the hinged computer device 100 (FIG. 1) and/or the hinged computer device 300 (FIG. 3) and may include a first side and a second side, the first side and the second side coupled to each other by a hinge assembly located intermediate to the first side and the second side. The PCB 602 and components on the PCB 602 may be located in the first side of the computer device 600 and the touchscreen display 632 may be located in the second side of the computer device. A heat spreader assembly, such as heat spreader assembly 400, may include a flexible member 652 that is thermally coupled to PCB 602, or components thereof, that extends across the hinge assembly into the second side of the computer device 600, and that is thermally coupled to a heat dissipation member within the second side of the computer device 600. The heat spreader assembly may transfer heat from the PCB 602, or components thereof, to the heat dissipation member, the heat dissipation member dissipating the heat into the environment surrounding the computer device 600.

The communication chips 606 may enable wired and/or wireless communications for the transfer of data to and from the computer device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computer device 600 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 600 may be any other electronic device that processes data.

Example 1 may include an electronic device, comprising a component, a heat dissipation member coupled to the component via a flexible portion of the electronic device, the component located on a first side of the flexible portion and the heat dissipation member located on a second side of the flexible portion, and a flexible member thermally coupled to the component and the heat dissipation member, wherein the flexible member extends along the flexible portion from the first side to the second side and is to transfer heat from the component to the heat dissipation member.

Example 2 may include the electronic device of example 1, wherein the flexible member is a flexible graphite film.

Example 3 may include the electronic device of example 1, wherein the flexible member flexes as the flexible portion flexes.

Example 4 may include the electronic device of any of the examples 1-3, wherein the flexible portion is a hinge assembly that couples a first side of the of the electronic device to a second side of the electronic device, the hinge assembly being located intermediate to the first side of the electronic device and the second side of the electronic device.

Example 5 may include the electronic device of example 4, wherein the component is located in the first side of the electronic device and the heat dissipation member is located in the second side of the electronic device, and wherein the flexible member flexes as the hinge assembly swivels.

Example 6 may include the electronic device of example 4, wherein the hinge assembly is surrounded by a superelastic material, and wherein the flexible member is affixed to a portion of the superelastic material opposite to the hinge assembly.

Example 7 may include the electronic device of example 6, wherein the superelastic material includes nitinol.

Example 8 may include the electronic device of any of the examples 1-3, wherein the heat dissipation member is a heat sink.

Example 9 may include the electronic device of any of the examples 1-3, wherein the heat dissipation member includes a protective layer that extends along a length of the flexible member and protects the flexible member from physical damage.

Example 10 may include the electronic device of any of the examples 1-3, wherein the flexible member is thermally coupled to the component via a heat spreader of the component, the heat spreader located on the first side of the flexible portion, and the flexible member being affixed to the heat spreader via a pressure sensitive adhesive.

Example 11 may include the electronic device of any of the examples 1-3, wherein the component is attached to a printed circuit board of the electronic device, the printed circuit board being located in the first side of the electronic device, and wherein the heat dissipation member is located in a screen portion of the electronic device, the screen portion being located in the second side of the electronic device.

Example 12 may include the electronic device of any of the examples 1-3, wherein the component is a system-on-chip of the electronic device, and wherein the heat dissipation member is a case of the electronic device.

Example 13 may include an electronic device, comprising electronic circuitry located on a first side of a flexible portion of the electronic device, a display located on a second side of the flexible portion, the display communicatively coupled to the electronic circuitry, and a flexible member thermally coupled to a component of the electronic circuitry and a heat dissipation member located on the second side of the flexible portion, wherein the flexible member extends along the flexible portion from the first side to the second side and is to transfer heat from the component to the heat dissipation member.

Example 14 may include the electronic device of example 13, wherein the flexible member is a flexible graphite film.

Example 15 may include the electronic device of any of the examples 13-14, further comprising a hinge assembly that couples a first side of the electronic device to a second side of the electronic device, the hinge assembly being located intermediate to the first side of the electronic device and the second side of the electronic device, wherein the flexible portion is the hinge assembly.

Example 16 may include the electronic device of example 15, wherein the flexible member is to flex as the hinge assembly swivels.

Example 17 may include the electronic device of example 15, further comprising a thermally conductive case that extends along an exterior of the second side of the electronic device, wherein the heat dissipation member includes at least a portion of the thermally conductive case.

Example 18 may include the electronic device of example 17, wherein the thermally conductive case is located, at least partially, on an opposite side of the electronic device from the display.

Example 19 may include the electronic device of example 15, further comprising a superelastic material that abuts at least a portion the hinge assembly, wherein the flexible member abuts the superelastic material on a side of the superelastic material opposite to the hinge assembly.

Example 20 may include the electronic device of example 19, wherein the superelastic material includes nitinol.

Example 21 may include the electronic device of any of the examples 13-14, wherein the component of the electronic circuitry is a system-on-chip, and wherein the flexible member is thermally coupled to the system-on-chip.

Example 22 may include the electronic device of any of the examples 13-14, further comprising a heat spreader coupled to the component of the electronic circuitry, wherein the flexible member is thermally coupled to the component via the heat spreader.

Example 23 may include the electronic device of example 22, wherein the flexible member is affixed to the heat spreader via a pressure sensitive adhesive.

Example 24 may include the electronic device of any of the examples 13-14, wherein the electronic device is a phone, a tablet, a phablet, or a laptop computer.

Example 25 may include a method of producing an electronic device, comprising thermally coupling a first portion of a flexible member to a component of electronic circuitry located on a first side of a flexible portion of the electronic device, and thermally coupling a second portion of the flexible member to a heat dissipation member located on a second side of the flexible portion, the flexible member extending along the flexible portion from the first side to the second side.

Example 26 may include the method of example 25, wherein thermally coupling the first portion of the flexible member to the component includes affixing the first portion to a heat spreader of the component via a pressure sensitive adhesive.

Example 27 may include the method of example 25, wherein thermally coupling the second portion of the flexible member to the heat dissipation member includes affixing the second portion of the flexible member to a thermally conductive case of the electronic device via a pressure sensitive adhesive, the thermally conductive case extending along an exterior of the electronic device.

Example 28 may include the method of example 25, wherein the flexible portion is a hinge assembly located intermediate to a first side of the electronic device and a second side of the electronic device, wherein the method further comprises forming a superelastic material along at least portion of a circumference of the hinge assembly, wherein a third portion of the flexible member abuts the superelastic material on an opposite side of the superelastic material from the hinge assembly.

Example 29 may include the method of any of the examples 25-28, wherein the flexible member is a flexible graphite film.

Example 30 may include the method of any of the examples 25-28, wherein the component is a system-on-chip of the electronic circuitry.

Example 31 may include an electronic device, comprising means for generation of heat being located on a first side of a flexible portion of the electronic device, means for heat dissipation being located on a second side of the flexible portion of the electronic device, and means for transfer of heat from the means for generation of heat to the means for heat dissipation, wherein the means for transfer of heat extends along the flexible portion from the first side to the second side.

Example 32 may include the electronic device of example 31, further comprising means for affixation of the means for transfer of heat to the means for generation of heat, and means for affixation of the means for transfer of heat to the means for heat dissipation.

Example 33 may include the electronic device of example 32, wherein the means for affixation of the means for transfer of heat to the means for generation of heat and the means for affixation of the means for transfer of heat to the means for heat dissipation include a pressure sensitive adhesive.

Example 34 may include the electronic device of example 31, wherein the means for heat dissipation includes a thermally conductive case of the electronic device, and wherein the thermally conductive case extends along an exterior of the electronic device.

Example 35 may include the electronic device of example 31, wherein the flexible portion is a hinge assembly that couples a first side of the electronic device to a second side of the electronic device, the hinge assembly being located intermediate the first side of the electronic device and the second side of the electronic device.

Example 36 may include the electronic device of example 35, wherein the means for heat transfer extends around a portion of a circumference of the hinge assembly and flexes as the hinge assembly swivels.

Example 37 may include the electronic device of any of the examples 31-36, wherein the means for transfer of heat includes a flexible graphite film.

Example 38 may include the electronic device of any of the examples 31-36, wherein the means for generation of heat includes a system-on-chip of the electronic device.

Example 39 may include the electronic device of any of the examples 31-36, wherein the electronic device is a phone, a tablet, a phablet, or a laptop computer.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An electronic device, comprising:
   a component;
   a heat dissipation member coupled to the component via a flexible portion of the electronic device, the component located on a first side of the flexible portion and the heat dissipation member located on a second side of the flexible portion;
   a flexible member thermally coupled to the component and the heat dissipation member, wherein the flexible member extends along the flexible portion from the first side of the flexible portion to the second side of the flexible portion and is to transfer heat from the component to the heat dissipation member, wherein the flexible portion is a hinge assembly that couples a first side of the electronic device to a second side of the electronic device, the hinge assembly being located intermediate to the first side of the electronic device and the second side of the electronic device, wherein the hinge assembly is surrounded by a superelastic material, and wherein the flexible member is affixed to the superelastic material opposite to the hinge assembly; and
   a structural memory member that extends along a portion of the flexible member and extends from the first side of the electronic device to the second side of the electronic device, wherein the structural memory member is to flex as the hinge assembly swivels and is to return to an original shape of the structural memory member in response to an application of heat.

2. The electronic device of claim 1, wherein the flexible member is a flexible graphite film.

3. The electronic device of claim 1, wherein the flexible member flexes as the flexible portion flexes.

4. The electronic device of claim 1, wherein the component is located in the first side of the electronic device and the heat dissipation member is located in the second side of the electronic device, and wherein the flexible member flexes as the hinge assembly swivels.

5. The electronic device of claim 1, wherein the superelastic material includes nitinol.

6. The electronic device of claim 1, wherein the heat dissipation member is a heat sink.

7. The electronic device of claim 1, wherein the heat dissipation member includes a protective layer that extends along a length of the flexible member and protects the flexible member from physical damage.

8. The electronic device of claim 1, wherein the flexible member is thermally coupled to the component via a heat spreader of the component, the heat spreader located on the first side of the flexible portion, and the flexible member being affixed to the heat spreader via a pressure sensitive adhesive.

9. The electronic device of claim 1, wherein the component is attached to a printed circuit board of the electronic device, the printed circuit board being located in the first side of the electronic device, and wherein the heat dissipation member is located in a screen portion of the electronic device, the screen portion being located in the second side of the electronic device.

10. The electronic device of claim 1, wherein the component is a system-on-chip of the electronic device, and wherein the heat dissipation member is a case of the electronic device.

11. An electronic device, comprising:
    electronic circuitry located on a first side of a flexible portion of the electronic device; a display located on a second side of the flexible portion, the display communicatively coupled to the electronic circuitry;
    a flexible member thermally coupled to a component of the electronic circuitry and a heat dissipation member located on the second side of the flexible portion, wherein the flexible member extends along the flexible portion from the first side of the flexible portion to the second side of the flexible portion and is to transfer heat from the component to the heat dissipation member;
    a hinge assembly that couples a first side of the electronic device to a second side of the electronic device, the hinge assembly being located intermediate to the first side of the electronic device and the second side of the electronic device, wherein the flexible portion is the hinge assembly;
    a superelastic material that abuts at least a portion the hinge assembly, wherein the flexible member abuts the superelastic material on a side of the superelastic material opposite to the hinge assembly; and
    a structural memory member that extends along a portion of the flexible member and extends from the first side of the electronic device to the second side of the electronic device across the hinge assembly, wherein the structural memory member is to flex as the hinge assembly swivels and is to return to an original shape of the structural memory member in response to an application of heat.

12. The electronic device of claim 11, wherein the flexible member is a flexible graphite film.

13. The electronic device of claim 11, further comprising a thermally conductive case that extends along an exterior of the second side of the electronic device, wherein the heat dissipation member includes at least a portion of the thermally conductive case.

14. The electronic device of claim 13, wherein the thermally conductive case is located, at least partially, on an opposite side of the electronic device from the display.

15. The electronic device of claim 11, wherein the superelastic material includes nitinol.

16. The electronic device of claim 11, further comprising a heat spreader coupled to the component of the electronic circuitry, wherein the flexible member is thermally coupled to the component via the heat spreader.

17. The electronic device of claim 11, wherein the component of the electronic circuitry is a system-on-chip, and wherein the flexible member is thermally coupled to the system-on-chip.

18. The electronic device of claim 11, wherein the electronic device is a phone, a tablet, a phablet, or a laptop computer.

19. A method of producing an electronic device, comprising:
thermally coupling a first portion of a flexible member to a component of electronic circuitry located on a first side of a flexible portion of the electronic device; and
thermally coupling a second portion of the flexible member to a heat dissipation member located on a second side of the flexible portion, the flexible member extending along the flexible portion from the first side to the second side, wherein the flexible portion is a hinge assembly located intermediate to a first side of the electronic device and a second side of the electronic device;
forming a superelastic material along at least a portion of a circumference of the hinge assembly, wherein a third portion of the flexible member abuts the superelastic material on an opposite side of the superelastic material from the hinge assembly; and
positioning a structural memory member to extend along a third portion of the flexible member and to extend from the first side of the electronic device to the second side of the electronic device, wherein the structural memory member is to flex as the hinge assembly swivels and is to return to an original shape of the structural memory member in response to an application of heat.

20. The method of claim 19, wherein thermally coupling the first portion of the flexible member to the component includes affixing the first portion to a heat spreader of the component via a pressure sensitive adhesive.

21. The method of claim 19, wherein thermally coupling the second portion of the flexible member to the heat dissipation member includes affixing the second portion of the flexible member to a thermally conductive case of the electronic device via a pressure sensitive adhesive, the thermally conductive case extending along an exterior of the electronic device.

22. The method of claim 19, wherein the flexible member is a flexible graphite film.

23. The method of claim 19, wherein the component is a system-on-chip of the electronic circuitry.

* * * * *

UNITED STATES PATENT AND TRADEMARK OFFICE
CERTIFICATE OF CORRECTION

PATENT NO. : 9,980,412 B2  
APPLICATION NO. : 15/280746  
DATED : May 22, 2018  
INVENTOR(S) : Bo Qiu et al.

Page 1 of 1

It is certified that error appears in the above-identified patent and that said Letters Patent is hereby corrected as shown below:

In the Claims

Column 20  
Line 44, Claim 11 "...portion the..." should read – "...portion of the..."

Signed and Sealed this  
Fourth Day of September, 2018

Andrei Iancu  
*Director of the United States Patent and Trademark Office*